(12) United States Patent
Roper et al.

(10) Patent No.: US 7,485,951 B2
(45) Date of Patent: Feb. 3, 2009

(54) MODULARIZED DIE STACKING SYSTEM AND METHOD

(75) Inventors: David L. Roper, Austin, TX (US); Curtis Hart, Round Rock, TX (US); James Wilder, Austin, TX (US); Phill Bradley, Pflugerville, TX (US); James G. Cady, Austin, TX (US); Jeff Buchle, Austin, TX (US); James Douglas Wehrly, Jr., Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 605 days.

(21) Appl. No.: 10/435,192

(22) Filed: May 9, 2003

(65) Prior Publication Data

US 2004/0000707 A1 Jan. 1, 2004

Related U.S. Application Data

(63) Continuation-in-part of application No. 10/005,581, filed on Oct. 26, 2001, now Pat. No. 6,576,992.

(51) Int. Cl.
*H01L 23/495* (2006.01)
*H01L 23/48* (2006.01)
*H05K 1/00* (2006.01)
*H05K 9/00* (2006.01)

(52) U.S. Cl. ............... 257/668; 257/688; 361/749; 361/776; 361/789; 174/254; 174/378

(58) Field of Classification Search ............... 257/777, 257/223.065, 686, 778, 736; 438/107–112; 361/749; 174/254
See application file for complete search history.

(56) References Cited

U.S. PATENT DOCUMENTS 3,411,122 A 11/1968 Schiller et al.
(Continued)

FOREIGN PATENT DOCUMENTS

DE 004215467 A1 11/1992
(Continued)

OTHER PUBLICATIONS

Dense-Pac Microsystems, 16 Megabit High Speed CMOS SRAM DPS1MX16MKn3.
(Continued)

*Primary Examiner*—Zandra Smith
*Assistant Examiner*—James M Mitchell
(74) *Attorney, Agent, or Firm*—Fish & Richardson P.C.

(57) ABSTRACT

An IC die and a flexible circuit structure are integrated into a lower stack element that can be stacked with either further integrated lower stack element iterations or with pre-packaged ICs in any of a variety of package types. The present invention may be employed to stack similar or dissimilar integrated circuits and may be used to create modularized systems. In a preferred embodiment, a die is positioned above the surface of portions of a pair of flex circuits. Connection is made between the die and the flex circuitry. A protective layer such as a molded plastic, for example, is formed to protect the flex-connected die and its connection to the flex. Connective elements are placed along the flex circuitry to create an array of module contacts along the second side of the flex circuitry. The flex circuitry is positioned above the body-protected die to create an integrated lower stack element. The integrated lower stack element may be stacked either with iterations of the integrated lower stack element or with a pre-packaged IC to create a multi-element stacked circuit module.

14 Claims, 9 Drawing Sheets

U.S. PATENT DOCUMENTS

| | | | |
|---|---|---|---|
| 3,436,604 A | 4/1969 | Hyltin | 317/101 |
| 3,654,394 A | 4/1972 | Gordon | 179/15 BL |
| 3,727,064 A | 4/1973 | Bottini | 250/217 |
| 3,746,934 A | 7/1973 | Stein | 317/101 |
| 3,766,439 A | 10/1973 | Isaacson | |
| 3,772,776 A | 11/1973 | Weisenburger | 29/628 |
| 3,806,767 A | 4/1974 | Lehrfeld | |
| 3,983,547 A | 9/1976 | Almasi | |
| 4,079,511 A | 3/1978 | Grabbe | |
| 4,103,318 A | 7/1978 | Schwede | 361/388 |
| 4,288,841 A | 9/1981 | Gogal | 361/414 |
| 4,381,421 A | 4/1983 | Coats et al. | |
| 4,398,235 A | 8/1983 | Lutz et al. | 361/393 |
| 4,406,508 A | 9/1983 | Sadigh-Behzadi | 339/75 |
| 4,420,794 A | 12/1983 | Anderson | |
| 4,437,235 A | 3/1984 | McIver | 29/840 |
| 4,466,183 A * | 8/1984 | Burns | 29/827 |
| 4,513,368 A | 4/1985 | Houseman | 364/200 |
| 4,587,596 A | 5/1986 | Bunnell | |
| 4,645,944 A | 2/1987 | Uya | 307/243 |
| 4,696,525 A | 9/1987 | Coller et al. | 439/69 |
| 4,712,129 A | 12/1987 | Orcutt | |
| 4,722,691 A | 2/1988 | Gladd et al. | |
| 4,733,461 A | 3/1988 | Nakano | 29/830 |
| 4,758,875 A | 7/1988 | Fujisaki et al. | |
| 4,763,188 A * | 8/1988 | Johnson | 257/777 |
| 4,821,007 A | 4/1989 | Fields et al. | 333/238 |
| 4,823,234 A | 4/1989 | Konishi et al. | 361/386 |
| 4,833,568 A | 5/1989 | Berhold | 361/383 |
| 4,839,717 A | 6/1989 | Phy et al. | |
| 4,862,249 A | 8/1989 | Carlson | 357/80 |
| 4,884,237 A | 11/1989 | Mueller et al. | |
| 4,891,789 A | 1/1990 | Quattrini et al. | 365/63 |
| 4,903,169 A | 2/1990 | Kitagawa et al. | |
| 4,911,643 A | 3/1990 | Perry et al. | 439/67 |
| 4,953,060 A | 8/1990 | Lauffer et al. | 361/388 |
| 4,956,694 A | 9/1990 | Eide | 357/74 |
| 4,983,533 A | 1/1991 | Go | 437/7 |
| 4,985,703 A | 1/1991 | Kaneyama | 341/141 |
| 5,012,323 A | 4/1991 | Farnworth | 357/75 |
| 5,016,138 A | 5/1991 | Woodman | 361/381 |
| 5,034,350 A | 7/1991 | Marchisi | 437/207 |
| 5,041,015 A | 8/1991 | Travis | 439/492 |
| 5,041,902 A | 8/1991 | McShane | |
| 5,050,039 A | 9/1991 | Edfors | |
| 5,057,903 A | 10/1991 | Olla | |
| 5,064,782 A | 11/1991 | Nishiguchi | |
| 5,068,708 A | 11/1991 | Newman | |
| 5,081,067 A | 1/1992 | Shimizu et al. | |
| 5,099,393 A | 3/1992 | Bentlage et al. | 361/413 |
| 5,104,820 A | 4/1992 | Go et al. | 437/51 |
| 5,117,282 A | 5/1992 | Salatino | |
| 5,122,862 A | 6/1992 | Kajihara et al. | |
| 5,138,430 A | 8/1992 | Gow, 3rd et al. | 357/70 |
| 5,138,434 A | 8/1992 | Wood et al. | |
| 5,158,912 A | 10/1992 | Kellerman et al. | |
| 5,159,434 A | 10/1992 | Kohno et al. | 357/80 |
| 5,159,535 A | 10/1992 | Desai et al. | |
| 5,168,926 A | 12/1992 | Watson et al. | |
| 5,198,888 A | 3/1993 | Sugano et al. | 257/686 |
| 5,198,965 A | 3/1993 | Curtis et al. | |
| 5,214,307 A | 5/1993 | Davis | |
| 5,219,794 A | 6/1993 | Satoh et al. | |
| 5,222,014 A | 6/1993 | Lin | 361/414 |
| 5,224,023 A | 6/1993 | Smith et al. | 361/412 |
| 5,229,641 A | 7/1993 | Katayama | |
| 5,229,916 A | 7/1993 | Frankeny et al. | |
| 5,239,198 A * | 8/1993 | Lin et al. | 257/693 |
| 5,240,588 A | 8/1993 | Uchida | |
| 5,241,454 A | 8/1993 | Ameen et al. | 361/744 |
| 5,243,133 A | 9/1993 | Engle et al. | |
| 5,247,423 A | 9/1993 | Lin et al. | 361/719 |
| 5,252,855 A | 10/1993 | Ogawa et al. | |
| 5,252,857 A | 10/1993 | Kane et al. | |
| 5,259,770 A | 11/1993 | Bates et al. | 439/66 |
| 5,261,068 A | 11/1993 | Gaskins et al. | 395/425 |
| 5,262,927 A | 11/1993 | Chia et al. | 361/784 |
| 5,276,418 A | 1/1994 | Klosowiak et al. | |
| 5,279,029 A | 1/1994 | Burns | 29/856 |
| 5,281,852 A | 1/1994 | Normington | 257/685 |
| 5,289,062 A | 2/1994 | Wyland | 307/577 |
| 5,289,346 A | 2/1994 | Carey et al. | |
| 5,311,401 A | 5/1994 | Gates, Jr. et al. | 361/760 |
| 5,313,097 A | 5/1994 | Haj-Ali-Ahmadi et al. | 257/706 |
| 5,337,388 A | 8/1994 | Jacobowitz et al. | |
| 5,343,075 A | 8/1994 | Nishino | 257/686 |
| 5,343,366 A | 8/1994 | Cipolla et al. | |
| 5,345,205 A | 9/1994 | Kornrumpf | |
| 5,347,159 A | 9/1994 | Khandros et al. | |
| 5,347,428 A | 9/1994 | Carson et al. | 361/760 |
| 5,357,478 A | 10/1994 | Kikuda et al. | |
| 5,361,228 A | 11/1994 | Adachi et al. | |
| 5,362,656 A | 11/1994 | McMahon | |
| 5,375,041 A | 12/1994 | McMahon | 361/749 |
| 5,377,077 A | 12/1994 | Burns | 361/704 |
| 5,384,690 A | 1/1995 | Davis et al. | |
| 5,386,341 A | 1/1995 | Olson et al. | |
| 5,394,010 A | 2/1995 | Tazawa et al. | 257/686 |
| 5,394,303 A * | 2/1995 | Yamaji | 361/749 |
| 5,396,573 A | 3/1995 | Ecker et al. | |
| 5,397,916 A | 3/1995 | Normington | |
| 5,402,006 A | 3/1995 | O'Donley | 257/796 |
| 5,420,751 A | 5/1995 | Burns | 361/707 |
| 5,428,190 A | 6/1995 | Stopperan | 174/261 |
| 5,432,630 A | 7/1995 | Lebby et al. | |
| 5,438,224 A | 8/1995 | Papageorge et al. | |
| 5,446,620 A | 8/1995 | Burns et al. | 361/704 |
| 5,448,511 A | 9/1995 | Paurus et al. | |
| 5,455,740 A | 10/1995 | Burns | 361/735 |
| 5,475,920 A | 12/1995 | Burns et al. | 29/856 |
| 5,477,082 A | 12/1995 | Buckley, III et al. | |
| 5,479,318 A | 12/1995 | Burns | 361/735 |
| 5,484,959 A | 1/1996 | Burns | 174/524 |
| 5,493,476 A | 2/1996 | Burns | 361/735 |
| 5,499,160 A | 3/1996 | Burns | 361/704 |
| 5,502,333 A | 3/1996 | Bertin et al. | |
| 5,509,197 A | 4/1996 | Stone | |
| 5,514,907 A | 5/1996 | Moshayedi | 257/723 |
| 5,516,989 A | 5/1996 | Uedo et al. | |
| 5,523,619 A | 6/1996 | McAllister et al. | 257/686 |
| 5,523,695 A | 6/1996 | Lin | |
| 5,541,812 A | 7/1996 | Burns | 361/735 |
| 5,543,664 A | 8/1996 | Burns | 257/787 |
| 5,561,591 A | 10/1996 | Burns | 361/704 |
| 5,566,051 A | 10/1996 | Burns | 361/704 |
| 5,572,065 A | 11/1996 | Burns | 257/666 |
| 5,588,205 A | 12/1996 | Roane | |
| 5,592,364 A | 1/1997 | Roane | 361/735 |
| 5,594,275 A | 1/1997 | Kwon et al. | |
| 5,610,833 A | 3/1997 | Chang et al. | |
| 5,612,570 A | 3/1997 | Eide et al. | 257/686 |
| 5,615,089 A | 3/1997 | Yoneda et al. | |
| 5,620,782 A | 4/1997 | Davis et al. | |
| 5,631,193 A | 5/1997 | Burns | 29/827 |
| 5,642,055 A | 6/1997 | Difrancesco | |
| 5,644,161 A | 7/1997 | Burns | 257/668 |
| 5,644,839 A | 7/1997 | Stone | |
| 5,646,446 A | 7/1997 | Nicewarner, Jr. et al. | |
| 5,654,877 A | 8/1997 | Burns | 361/713 |
| 5,657,537 A | 8/1997 | Saia et al. | |
| 5,677,569 A | 10/1997 | Choi et al. | |
| 5,717,556 A | 2/1998 | Yanagida | |
| 5,729,894 A | 3/1998 | Rostoker et al. | |
| 5,744,827 A | 4/1998 | Jeong et al. | |

| | | | |
|---|---|---|---|
| 5,751,553 A | 5/1998 | Clayton | |
| 5,763,296 A | 6/1998 | Casati et al. | |
| 5,764,497 A | 6/1998 | Mizumo et al. | |
| 5,776,797 A * | 7/1998 | Nicewarner et al. | 438/107 |
| 5,778,522 A | 7/1998 | Burns | 29/830 |
| 5,783,464 A | 7/1998 | Burns | |
| 5,789,815 A | 8/1998 | Tessier et al. | |
| 5,801,437 A | 9/1998 | Burns | 257/685 |
| 5,801,439 A * | 9/1998 | Fujisawa et al. | 257/686 |
| 5,804,870 A | 9/1998 | Burns | |
| 5,805,422 A | 9/1998 | Otake et al. | 361/749 |
| 5,828,125 A | 10/1998 | Burns | 257/668 |
| 5,835,988 A | 11/1998 | Ishii | 257/684 |
| 5,841,721 A | 11/1998 | Kwon et al. | |
| 5,852,326 A | 12/1998 | Khandros et al. | |
| 5,869,353 A | 2/1999 | Levy et al. | 438/109 |
| 5,895,969 A | 4/1999 | Masuda et al. | |
| 5,895,970 A | 4/1999 | Miyoshi et al. | |
| 5,899,705 A | 5/1999 | Akram | |
| 5,917,709 A | 6/1999 | Johnson et al. | |
| 5,922,061 A * | 7/1999 | Robinson | 710/109 |
| 5,925,934 A | 7/1999 | Lim | |
| 5,926,369 A | 7/1999 | Ingraham et al. | 361/699 |
| 5,933,712 A | 8/1999 | Bernhardt et al. | |
| 5,949,657 A | 9/1999 | Karabatsos | 361/803 |
| 5,953,215 A | 9/1999 | Karabatsos | 361/767 |
| 5,959,839 A | 9/1999 | Gates | |
| 5,963,427 A | 10/1999 | Bolleson | |
| 5,973,395 A * | 10/1999 | Suzuki et al. | 257/692 |
| 5,995,370 A | 11/1999 | Nakamori | |
| 6,002,167 A * | 12/1999 | Hatano et al. | 257/696 |
| 6,002,589 A | 12/1999 | Perino et al. | |
| 6,013,948 A | 1/2000 | Akram et al. | |
| 6,014,316 A * | 1/2000 | Eide | 361/735 |
| 6,025,642 A | 2/2000 | Burns | 257/686 |
| 6,028,352 A | 2/2000 | Eide | 257/686 |
| 6,028,365 A * | 2/2000 | Akram et al. | 257/778 |
| 6,034,878 A | 3/2000 | Osaka et al. | |
| 6,040,624 A | 3/2000 | Chambers et al. | |
| 6,084,293 A * | 7/2000 | Ohuchi | 257/686 |
| 6,084,294 A * | 7/2000 | Tomita | 257/686 |
| 6,084,778 A | 7/2000 | Malhi | |
| 6,097,087 A | 8/2000 | Farnworth et al. | 257/698 |
| 6,102,710 A | 8/2000 | Beilin et al. | |
| 6,111,761 A | 8/2000 | Peana et al. | |
| 6,114,763 A | 9/2000 | Smith | |
| 6,121,676 A | 9/2000 | Solberg | |
| RE36,916 E | 10/2000 | Moshayedi | 257/723 |
| 6,130,477 A | 10/2000 | Chen et al. | |
| 6,157,541 A | 12/2000 | Hacke | |
| 6,165,817 A | 12/2000 | Akram | |
| 6,166,443 A | 12/2000 | Inaba et al. | |
| 6,172,874 B1 | 1/2001 | Bartilson | 361/719 |
| 6,178,093 B1 | 1/2001 | Bhatt et al. | |
| 6,186,106 B1 | 2/2001 | Glovatsky | |
| 6,187,652 B1 | 2/2001 | Chou et al. | |
| 6,205,654 B1 | 3/2001 | Burns | 29/830 |
| 6,208,521 B1 * | 3/2001 | Nakatsuka | 361/749 |
| 6,218,731 B1 | 4/2001 | Huang et al. | |
| 6,222,737 B1 | 4/2001 | Ross | |
| 6,225,688 B1 | 5/2001 | Kim et al. | 257/686 |
| 6,233,650 B1 | 5/2001 | Johnson et al. | 711/5 |
| 6,234,820 B1 | 5/2001 | Perino et al. | |
| 6,236,565 B1 | 5/2001 | Gordon | |
| 6,262,476 B1 | 7/2001 | Vidal | 257/686 |
| 6,262,895 B1 | 7/2001 | Forthun | 361/749 |
| 6,265,660 B1 * | 7/2001 | Tandy | 174/52.4 |
| 6,265,766 B1 | 7/2001 | Moden | |
| 6,266,252 B1 | 7/2001 | Karabatsos | 361/788 |
| 6,271,058 B1 | 8/2001 | Yoshida | |
| 6,272,741 B1 | 8/2001 | Kennedy et al. | |
| 6,281,577 B1 | 8/2001 | Oppermann et al. | 257/724 |
| 6,285,560 B1 | 9/2001 | Lyne | |
| 6,288,907 B1 | 9/2001 | Burns | |
| 6,300,679 B1 * | 10/2001 | Mukerji et al. | 257/738 |
| 6,303,981 B1 | 10/2001 | Moden | |
| 6,310,392 B1 | 10/2001 | Burns | |
| 6,313,998 B1 | 11/2001 | Kledzik | |
| 6,316,825 B1 | 11/2001 | Park et al. | |
| 6,320,137 B1 | 11/2001 | Bonser et al. | |
| 6,323,060 B1 * | 11/2001 | Isaak | 438/109 |
| 6,329,708 B1 | 12/2001 | Komiyama | |
| 6,336,262 B1 | 1/2002 | Dalal et al. | |
| 6,351,029 B1 * | 2/2002 | Isaak | 257/688 |
| 6,360,433 B1 | 3/2002 | Ross | |
| 6,360,935 B1 | 3/2002 | Flake | |
| 6,368,896 B2 | 4/2002 | Farnworth et al. | 438/113 |
| 6,376,769 B1 * | 4/2002 | Chung | 174/52.2 |
| 6,384,339 B1 | 5/2002 | Neuman | |
| 6,392,162 B1 | 5/2002 | Karabatsos | 174/261 |
| 6,410,857 B1 | 6/2002 | Gonya | 174/254 |
| 6,414,384 B1 | 7/2002 | Lo et al. | |
| 6,423,622 B1 | 7/2002 | Chen et al. | |
| 6,426,240 B2 | 7/2002 | Isaak | 438/106 |
| 6,426,549 B1 | 7/2002 | Isaak | 257/686 |
| 6,426,560 B1 | 7/2002 | Kawamura et al. | |
| 6,433,418 B1 * | 8/2002 | Fujisawa et al. | 257/696 |
| 6,437,990 B1 | 8/2002 | Degani et al. | |
| 6,444,490 B2 | 9/2002 | Bertin et al. | |
| 6,444,921 B1 * | 9/2002 | Wang et al. | 174/260 |
| 6,446,158 B1 | 9/2002 | Karabatsos | 711/5 |
| 6,447,321 B1 | 9/2002 | Perino et al. | |
| 6,449,159 B1 | 9/2002 | Haba | |
| 6,452,826 B1 | 9/2002 | Kim et al. | |
| 6,462,408 B1 | 10/2002 | Wehrly, Jr. | |
| 6,462,412 B2 * | 10/2002 | Kamei et al. | 257/723 |
| 6,462,423 B1 | 10/2002 | Akram et al. | |
| 6,465,877 B1 | 10/2002 | Farnworth et al. | 257/668 |
| 6,465,893 B1 * | 10/2002 | Khandros et al. | 257/777 |
| 6,473,308 B2 | 10/2002 | Forthun | 361/749 |
| 6,486,544 B1 * | 11/2002 | Hashimoto | 257/686 |
| 6,487,078 B2 | 11/2002 | Kledzik et al. | |
| 6,489,178 B2 | 12/2002 | Coyle et al. | |
| 6,489,687 B1 | 12/2002 | Hashimoto | |
| 6,492,718 B2 | 12/2002 | Ohmori | |
| 6,500,697 B2 | 12/2002 | Ahmad | |
| 6,504,104 B2 | 1/2003 | Hacke et al. | |
| 6,509,639 B1 | 1/2003 | Lin | |
| 6,514,793 B2 | 2/2003 | Isaak | 438/109 |
| 6,522,018 B1 | 2/2003 | Tay et al. | |
| 6,528,870 B2 | 3/2003 | Fukatsu et al. | |
| 6,532,162 B2 | 3/2003 | Schoenborn | |
| 6,538,895 B2 | 3/2003 | Worz et al. | |
| 6,549,413 B2 | 4/2003 | Karnezos et al. | |
| 6,552,910 B1 | 4/2003 | Moon et al. | |
| 6,559,521 B2 | 5/2003 | Tuttle | |
| 6,560,117 B2 * | 5/2003 | Moon | 361/749 |
| 6,572,387 B2 * | 6/2003 | Burns et al. | 439/69 |
| 6,576,992 B1 | 6/2003 | Cady et al. | |
| 6,588,095 B2 | 7/2003 | Pan | |
| 6,590,282 B1 | 7/2003 | Wang et al. | 257/686 |
| 6,600,222 B1 * | 7/2003 | Levardo | 257/686 |
| 6,608,763 B1 | 8/2003 | Burns et al. | |
| 6,614,664 B2 | 9/2003 | Lee | |
| 6,617,510 B2 | 9/2003 | Schreiber et al. | |
| 6,620,651 B2 * | 9/2003 | He et al. | 438/113 |
| 6,624,507 B1 | 9/2003 | Nguyen et al. | |
| 6,627,984 B2 | 9/2003 | Bruce et al. | |
| 6,646,333 B1 | 11/2003 | Hogerl | |
| 6,657,134 B2 | 12/2003 | Spielberger et al. | |
| 6,660,561 B2 | 12/2003 | Forthun | |
| 6,670,700 B1 | 12/2003 | Hashimoto | |
| 6,673,651 B2 | 1/2004 | Ohuchi et al. | |
| 6,677,670 B2 * | 1/2004 | Kondo | 257/686 |
| 6,683,377 B1 * | 1/2004 | Shim et al. | 257/723 |
| 6,689,634 B1 | 2/2004 | Lyne | |

| | | |
|---|---|---|
| 6,690,584 B2 | 2/2004 | Uzuka et al. |
| 6,699,730 B2 | 3/2004 | Kim et al. |
| 6,707,148 B1 | 3/2004 | Mostafazedeh et al. |
| 6,707,684 B1 | 3/2004 | Andric et al. |
| 6,709,893 B2 | 3/2004 | Moden et al. |
| 6,724,076 B1 | 4/2004 | Kahlisch et al. |
| 6,746,894 B2 | 6/2004 | Fee et al. |
| 6,762,495 B1 | 7/2004 | Reyes et al. |
| 6,762,769 B2 | 7/2004 | Guo et al. |
| 6,765,288 B2 | 7/2004 | Damberg |
| 6,768,660 B2 | 7/2004 | Kong et al. |
| 6,773,848 B1 | 8/2004 | Nortoft et al. |
| 6,776,797 B1 | 8/2004 | Blom |
| 6,778,404 B1 | 8/2004 | Bolken et al. |
| 6,781,240 B2 | 8/2004 | Choi et al. |
| 6,803,651 B1 | 10/2004 | Chiang |
| 6,812,567 B2 | 11/2004 | Kim et al. |
| 6,821,029 B1 | 11/2004 | Grung et al. |
| 6,833,984 B1 | 12/2004 | Belgacem |
| 6,841,855 B2 * | 1/2005 | Jaeck et al. ............... 257/668 |
| 6,849,949 B1 | 2/2005 | Lyu et al. |
| 6,867,496 B1 | 3/2005 | Hashimoto |
| 6,869,825 B2 * | 3/2005 | Chiu ........................ 438/106 |
| 6,876,074 B2 | 4/2005 | Kim |
| 6,879,047 B1 * | 4/2005 | Heo ........................ 257/777 |
| 6,884,653 B2 | 4/2005 | Larson |
| 6,891,729 B2 | 5/2005 | Ko et al. |
| 6,893,897 B2 | 5/2005 | Sweterlitsch |
| 6,908,792 B2 | 6/2005 | Bruce et al. |
| 6,914,324 B2 | 7/2005 | Rapport et al. |
| 6,919,626 B2 | 7/2005 | Burns |
| 6,955,945 B2 * | 10/2005 | Rapport et al. ............ 438/107 |
| 6,965,166 B2 | 11/2005 | Hikita et al. |
| 6,998,704 B2 * | 2/2006 | Yamazaki et al. ......... 257/688 |
| 7,023,701 B2 | 4/2006 | Stocken et al. |
| 7,081,373 B2 | 7/2006 | Roeters et al. |
| 7,104,804 B2 | 9/2006 | Batinovich |
| 7,129,571 B2 | 10/2006 | Kang |
| 2001/0006252 A1 | 7/2001 | Kim et al. |
| 2001/0013423 A1 | 8/2001 | Dalal et al. |
| 2001/0015487 A1 * | 8/2001 | Forthun ..................... 257/685 |
| 2001/0035572 A1 * | 11/2001 | Isaak ........................ 257/678 |
| 2001/0040793 A1 * | 11/2001 | Inaba ........................ 361/749 |
| 2002/0006032 A1 | 1/2002 | Karabatsos ................ 361/760 |
| 2002/0030995 A1 * | 3/2002 | Shoji ........................ 362/328 |
| 2002/0044423 A1 | 4/2002 | Primavera et al. |
| 2002/0048849 A1 | 4/2002 | Isaak |
| 2002/0076919 A1 | 6/2002 | Peters et al. |
| 2002/0101261 A1 | 8/2002 | Karabatsos ................ 326/83 |
| 2002/0114143 A1 | 8/2002 | Morrison et al. |
| 2002/0126951 A1 | 9/2002 | Sutherland et al. |
| 2002/0139577 A1 * | 10/2002 | Miller ........................ 174/261 |
| 2002/0164838 A1 * | 11/2002 | Moon et al. ............... 438/107 |
| 2002/0180022 A1 * | 12/2002 | Emoto ....................... 257/686 |
| 2003/0016710 A1 | 1/2003 | Kamoto |
| 2003/0045025 A1 | 3/2003 | Coyle et al. |
| 2003/0049886 A1 | 3/2003 | Salmon |
| 2003/0067064 A1 * | 4/2003 | Kim ........................... 257/686 |
| 2003/0081392 A1 | 5/2003 | Cady et al. |
| 2003/0107118 A1 | 6/2003 | Pflughaupt et al. |
| 2003/0109078 A1 * | 6/2003 | Takahashi et al. ......... 438/106 |
| 2003/0113998 A1 | 6/2003 | Ross |
| 2003/0164551 A1 * | 9/2003 | Lee et al. ................... 257/778 |
| 2003/0168725 A1 * | 9/2003 | Warner et al. ............. 257/686 |
| 2004/0000708 A1 * | 1/2004 | Rapport et al. ............ 257/686 |
| 2004/0004281 A1 | 1/2004 | Bai et al. |
| 2004/0021211 A1 | 2/2004 | Damberg |
| 2004/0028936 A1 | 2/2004 | Kogiso et al. |
| 2004/0031972 A1 | 2/2004 | Pflughaupt et al. |
| 2004/0045159 A1 | 3/2004 | DiStefano et al. |
| 2004/0065963 A1 * | 4/2004 | Karnezos ................... 257/777 |
| 2004/0075991 A1 | 4/2004 | Haba et al. |
| 2004/0099938 A1 | 5/2004 | Kang et al. |
| 2004/0104470 A1 | 6/2004 | Bang et al. |
| 2004/0115866 A1 * | 6/2004 | Bang et al. ................ 438/125 |
| 2004/0124527 A1 * | 7/2004 | Chiu ........................ 257/723 |
| 2004/0150107 A1 | 8/2004 | Cha et al. |
| 2004/0157352 A1 | 8/2004 | Beroz et al. |
| 2004/0173902 A1 | 9/2004 | Kim et al. |
| 2004/0203190 A1 | 10/2004 | Pflughaupt et al. |
| 2004/0217461 A1 | 11/2004 | Damberg |
| 2004/0217471 A1 | 11/2004 | Haba |
| 2004/0238931 A1 | 12/2004 | Haba et al. |
| 2004/0245617 A1 | 12/2004 | Damberg et al. |
| 2004/0267409 A1 | 12/2004 | De Lorenzo et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0047250 A1 | 3/2005 | Ruckerbauer et al. |
| 2005/0133897 A1 | 6/2005 | Baek et al. |

FOREIGN PATENT DOCUMENTS

| | | |
|---|---|---|
| DE | 004214102 A1 | 12/1992 |
| EP | 122-687 A | 10/1984 |
| EP | 0 298 211 A | 1/1989 |
| EP | 0426-303 A2 | 10/1990 |
| EP | 461-639 A | 12/1991 |
| JP | 57-31166 A | 2/1982 |
| JP | 58-96756 A | 6/1983 |
| JP | 58-112348 A | 7/1983 |
| JP | 359088863 A | 5/1984 |
| JP | 60-254762 | 12/1985 |
| JP | 60-254762 A | 12/1985 |
| JP | 60254762 | 12/1985 |
| JP | 3641047659 A | 3/1986 |
| JP | 62-230027 A | 8/1987 |
| JP | 62-230027 A | 10/1987 |
| JP | 63-153849 A | 6/1988 |
| JP | 4-209562 A | 7/1992 |
| JP | 404368167 A | 12/1992 |
| JP | 5-21697 A | 1/1993 |
| JP | 50-29534 A | 2/1993 |
| JP | 63-153849 A | 6/1998 |
| JP | 2000-88921 | 3/2000 |
| JP | 2000/307029 A | 11/2000 |
| JP | 2001077294 A | 3/2001 |
| JP | 2001085592 A | 3/2001 |
| JP | 2001332683 A | 11/2001 |
| JP | 2003037246 A | 2/2003 |
| JP | 2003086760 A | 3/2003 |
| JP | 2003086761 A | 3/2003 |
| JP | 2003/309247 A | 10/2003 |
| JP | 2003309246 A | 10/2003 |
| JP | 2003/347475 A | 12/2003 |
| JP | 2003/347503 A | 12/2003 |
| SU | 834-957 | 5/1981 |
| WO | WO9744824 | 11/1997 |
| WO | WO 03/037053 A1 | 5/2003 |

OTHER PUBLICATIONS

Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS512X16A3, Ceramic 512K×16 CMOS SRAM Module.

"Design Techniques for Ball Grid Arrays," William R. Newberry, Xynetix Design Systems, Inc.

"Chip Scale Packaging and Redistribution," Paul A. Magill, Glenn A. Rinne, J. Daniel Mis, Wayne C. Machon, Joseph W. Baggs, Unitive Electronics Inc.

"Alterable Interposer Block for Personalizing Stacked Module Interconnections," *IBM Technical Disclosure Bulletin*, vol. 30, No. 8, Jan. 8, 1988, pp. 373-374.

IBM Preliminary 168 Pin SDRAM Registered DIMM Functional Description & Timing Diagrams.

"3D Interconnection for Ultra-Dense Multichip Modules," Christian Val, Thomson-CSF DCS Computer Division, Thierry Lemoine, Thomson-CSF RCM Radar Countermeasures Division.

"High Density Memory Packaging Technology High Speed Imaging Applications," Dean Frew, Texas Instruments Incorporated.

Teresa Technologies, Inc.—Semiconductor Intellectual Property, Chip Scale Packaging—Website pp. (3).

"Tessera Introduces uZ™—Ball Stacked Memory Package for Computing and Portable Electronic Products" Joyce Smaragdis, Tessera Public Relations.

"Vertically-Intergrated Package," Alvin Weinberg Pacesetter, Inc. and W. Kinzy Jones, Florida International University.

Ron Bauer, Intel. "Stacked-CSP Delivers Flexibility, Reliability, and Space-Saving Capabilities", Spring 2002.

Tessera uZ Ball Stack Package. 4 figures that purport to be directed to the uZ—Ball Stacked Memory Page.

Chip Scale Review Online—An Independent Journal Dedicated to the Advancement of Chip-Scale Electronics. (Website 9 pages) Fjelstad, Joseph, Pacific Consultants L.L.C.

Flexible Thinking: Examining the Flexible Circuit Tapes. (Website 2 pages) Fjelstad, Joseph.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002.

Flexible Printed Circuit Technology—A Versatile Interconnection Option. (Website 2 pages) Fjelstad, Joseph. Dec. 3, 2002.

1992 Proceedings, 42nd Electronic Components & Technology Conference, May 18-20, 1992.

Research Disclosure, Organic Card Device Carrier, 31318, May 1990, No. 313.

IBM Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mount—A 3D Hybrid Wafer Scale Integration Technology, International Electron Device Meeting, IEDM Technical Digest, Washington, D.C., Dec. 6-9, 1987.

PCT/US2005/013345, International Preliminary Report on Patentability dated Nov. 2, 2006.

PCT/US2005/016764; International Preliminary Report on Patentability dated Nov. 23, 2006.

PCT/US2005/010756, International Search Report and Written Opinion dated Oct. 12, 2006.

PCT/US2005/010756, International Preliminary Report on Patentability dated Apr. 12, 2007.

PCT/US2005/039307, International Search Report and Written Opinion dated Sep. 26, 2006.

PCT/US2006/017015, International Search Report and Written Opinion dated Oct. 17, 2006.

PCT/US2005/013336, International Preliminary Report on Patentability dated Nov. 9, 2006.

Howard W. Markstein, Wester Editor, Rigid-Flex: A Maturing Technology dated Feb. 1996, Electronic Packaging & Production.

Design Requirements for Outlines of Solid State and Related Products, Ball Grid Array Package (BGA), Sep. 2005, Jedec Publication 95.

William R. Newberry, Xynetix Design Systems, Inc., Design Techniques for Ball Grid Arrays, 1997 published on the Internet.

* cited by examiner

MODULARIZED DIE STACKING SYSTEM AND METHOD

RELATED APPLICATIONS

This application is a continuation-in-part of U.S. application Ser. No. 10/005,581, filed Oct. 26, 2001, now U.S. Pat. No. 6,576,992, issued Jun. 10, 2003, which is hereby incorporated by reference for all purposes.

TECHNICAL FIELD

The present invention relates to aggregating integrated circuits and, in particular, to stacking integrated circuits.

BACKGROUND OF THE INVENTION

A variety of techniques are used to stack integrated circuits. Some methods require special packages, while other techniques stack conventional packages and still others stack multiple die within a single package. In some stacks, the leads of the packaged integrated circuits are used to create a stack, while in other systems, added structures such as rails provide all or part of the interconnection between packages. In still other techniques, flexible conductors with certain characteristics are used to selectively interconnect packaged integrated circuits. In yet other methods, one IC is connected to another within a single plastic body from which leads or contacts emerge.

The predominant package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages have recently gained market share.

One family of alternative packages is identified generally by the term "chip scale packaging" or CSP. CSP refers generally to packages that provide connection to an integrated circuit through a set of contacts (often embodied as "bumps" or "balls") arrayed across a major surface of the package. Instead of leads emergent from a peripheral side of the package, contacts are placed on a major surface and typically emerge from the planar bottom surface of the package.

The goal of CSP is to occupy as little area as possible and, preferably, approximately the area of the encapsulated IC. Therefore, CSP leads or contacts do not typically extend beyond the outline perimeter of the package. The absence of "leads" on package sides renders most stacking techniques devised for leaded packages inapplicable for CSP stacking.

CSP has enabled reductions in size and weight parameters for many applications. For example, micro ball grid array for flash and SRAM and wirebond on tape or rigid laminate CSPs for SRAM or EEPROM have been employed in a variety of applications. CSP is a broad category including a variety of packages from near chip scale to die-sized packages such as the die sized ball grid array (DSBGA) recently described in proposed JEDEC standard 95-1 for DSBGA. To meet the continuing demands for cost and form factor reduction with increasing memory capacities, CSP technologies that aggregate integrated circuits in CSP technology have recently been developed. For example, Sharp, Hitachi, Mitsubishi and Intel support what are called the S-CSP specifications for flash and SRAM applications. Those S-CSP specifications describe, however, stacking multiple die within a single chip scale package and do not describe stacking integrated circuits that are individually modularized in plastic, either as BGA's or other common CSP packages. Stacking integrated circuits within a single package requires specialized technology that includes reformulation of package internals and significant expense with possible supply chain vulnerabilities.

There are several known techniques for stacking packages articulated in chip scale technology. For example, the assignee of the present invention has developed previous systems for aggregating micro-BGA packages in space saving topologies. The assignee of the present invention has systems for stacking BGA packages on a DIMM in a RAM-BUS environment.

In U.S. Pat. No. 6,205,654 B1 owned by the assignee of the present invention, a system for stacking ball grid array packages that employs lead carriers to extend connectable points out from the packages is described. Other known techniques add structures to a stack of BGA-packaged ICs. Still others aggregate CSPs on a DIMM with angular placement of the packages. Such techniques provide alternatives, but require topologies of added cost and complexity.

U.S. Pat. No. 6,262,895 B1 to Forthun (the "Forthun patent") purports to disclose a technique for stacking chip scale packaged ICs. The Forthun patent discloses a "package" that exhibits a flex circuit wrapped partially about a CSP. The flex circuit is said to have pad arrays on upper and lower surfaces of the flex.

The flex circuit of the Forthun "package" has a pad array on its upper surface and a pad array centrally located upon its lower surface. On the lower surface of the flex there are third and fourth arrays on opposite sides from the central lower surface pad array. To create the package of Forthun, a CSP contacts the pad array located on the upper surface of the flex circuit. As described in the Forthun patent, the contacts on the lower surface of the CSP are pushed through "slits" in the upper surface pads and advanced through the flex to protrude from the pads of the lower surface array and, therefore, the bottom surface of the package. Thus, the contacts of the CSP serve as the contacts for the package. The sides of the flex are partially wrapped about the CSP to adjacently place the third and fourth pad arrays above the upper major surface of the CSP to create from the combination of the third and fourth pad arrays, a fifth pad array for connection to another such package. Thus, as described in the Forthun disclosure, a stacked module of CSPs created with the described packages will exhibit a flex circuit wrapped about each CSP in the module.

The previous known methods for stacking CSPs apparently have various deficiencies including complex structural arrangements and thermal or high frequency performance issues. To increase dissipation of heat generated by constituent CSPs, the thermal gradient between the lower CSP and upper CSP in a CSP stack or module should be minimized. Prior art solutions to CSP stacking do not, however, address thermal gradient minimization in disclosed constructions.

In other applications, module height concerns impact the utility of known solutions in integrated circuit aggregation. In some stacking solutions, the bad die problem is significant. Indigenous as well as processing-acquired defects can lead to unacceptably high failure rates for stacks created by aggregating IC elements before testing the constituent members of the assembly. For example, where stacking techniques employ one or more unpackaged die, there is typically not an opportunity for adequate preassembly test before the constituent ICs of the assembly are aggregated. Then, testing typically reveals bad stacks, it does not prevent their assembly and consequent waste of resources.

What is needed, therefore, is a technique and system for stacking integrated circuits using a technology that provides a thermally efficient, reliable structure that performs well at higher frequencies, but does not add excessive height to the stack yet allows pre-stacking test of constituent stack elements with production at reasonable cost with readily understood and managed materials and methods.

SUMMARY OF THE INVENTION

The present invention integrates an IC die and a flexible circuit structure into an integrated lower stack element that can be stacked with either further integrated lower stack element iterations or with pre-packaged ICs in any of a variety of package types. The present invention can be used to advantage where size minimization, thermal efficiency and or test before stacking are significant concerns. The present invention may be employed to stack similar or dissimilar integrated circuits and may be used to create modularized systems.

In the present invention, an IC die is integrated with flex circuitry to create an integrated lower stack element. In a preferred embodiment, a die is positioned above the surface of portions of a pair of flex circuits. Connection is made between the die and the flex circuitry. A protective layer such as a molded plastic, for example, is formed to create a body that protects the flex-connected die and its connection to the flex. Connective elements are placed along the flex circuits to create an array of module contacts along the second side of the flex circuitry. Portions of the pair of flex circuits are positioned above the body to create an integrated lower stack element. The integrated lower stack element may be stacked either with further iterations of the integrated lower stack element or with pre-packaged ICS to create a multi-element stacked circuit module. The present invention may be employed to advantage in numerous configurations and combinations in modules provided for high-density memories or high capacity computing.

DESCRIPTION OF PREFERRED EMBODIMENTS

Figure 1:
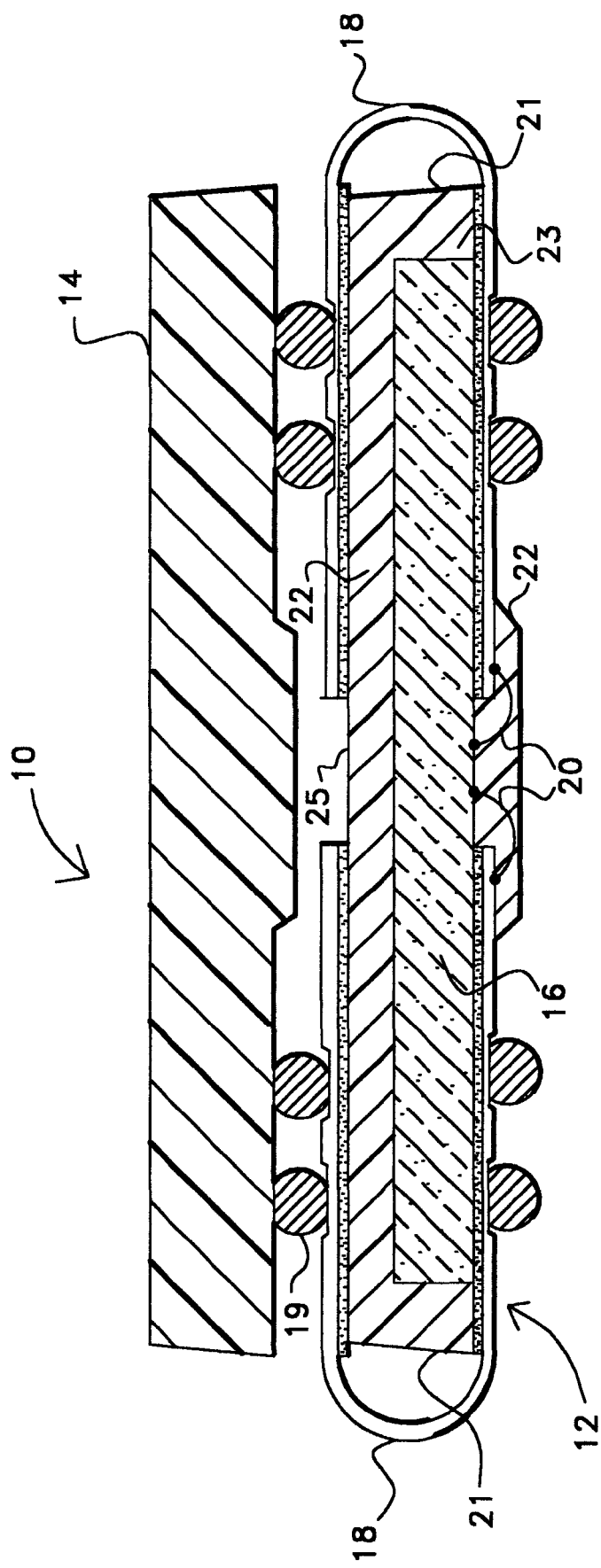
FIG. 1 is an elevation view of module 10 devised in accordance with a preferred embodiment of the present invention.

FIG. 1 is an elevation view of module 10 devised in accordance with a preferred embodiment of the present invention. Module 10 is comprised of integrated lower stack element 12 and upper IC element 14.

Upper IC element 14 that is depicted in FIG. 1 may be any of a variety of types and configurations of CSP such as, for example, those that are die-sized, as well those that are near chip-scale as well as the variety of ball grid array packages known in the art. Typical CSPs, such as, for example, ball-grid-array ("BGA"), micro-ball-grid array ("µBGA"), and fine-pitch ball grid array ("FBGA") packages have an array of connective contacts embodied, for example, as leads, bumps, solder balls, or balls that extend from a lower surface of a plastic casing in any of several patterns and pitches. An external portion of the connective contacts is often finished with a ball of solder. Collectively, these will be known herein as chip scale packaged integrated circuits (CSPs) and preferred embodiments will be described in terms of CSPs, but the particular configurations used in the explanatory figures are not, however, to be construed as limiting. For example, in the elevation view of FIG. 1, upper IC element 14 is depicted as a CSP of a particular profile known to those in the art, but it should be understood that the figures are exemplary only. Upper IC element 14 need not be limited to traditional CSP packaging and as those of skill recognize the opportunity, the present invention is adaptable to future package configurations. The present invention is advantageously employed with memory circuits but may be employed to advantage with logic and computing circuits even where the constituent elements of module 10 are dissimilar. Upper IC element 14 is shown with upper IC contacts 19.

Integrated lower stack element 12 is shown with die 16 and connections 20 that connect die 16 to flex circuits 18. Protective surround 22 is disposed to protect connections 20 and die 16. In a preferred embodiment, protective surround 22 is a plastic surround. As a protective surround 22 is formed about die 16, a body 23 is formed having lateral sides 21 and an upper surface 25. Protective body 23 will, in a preferred embodiment, surround portions of die 16 that would otherwise be exposed to potential environmental damage.

Figure 2:
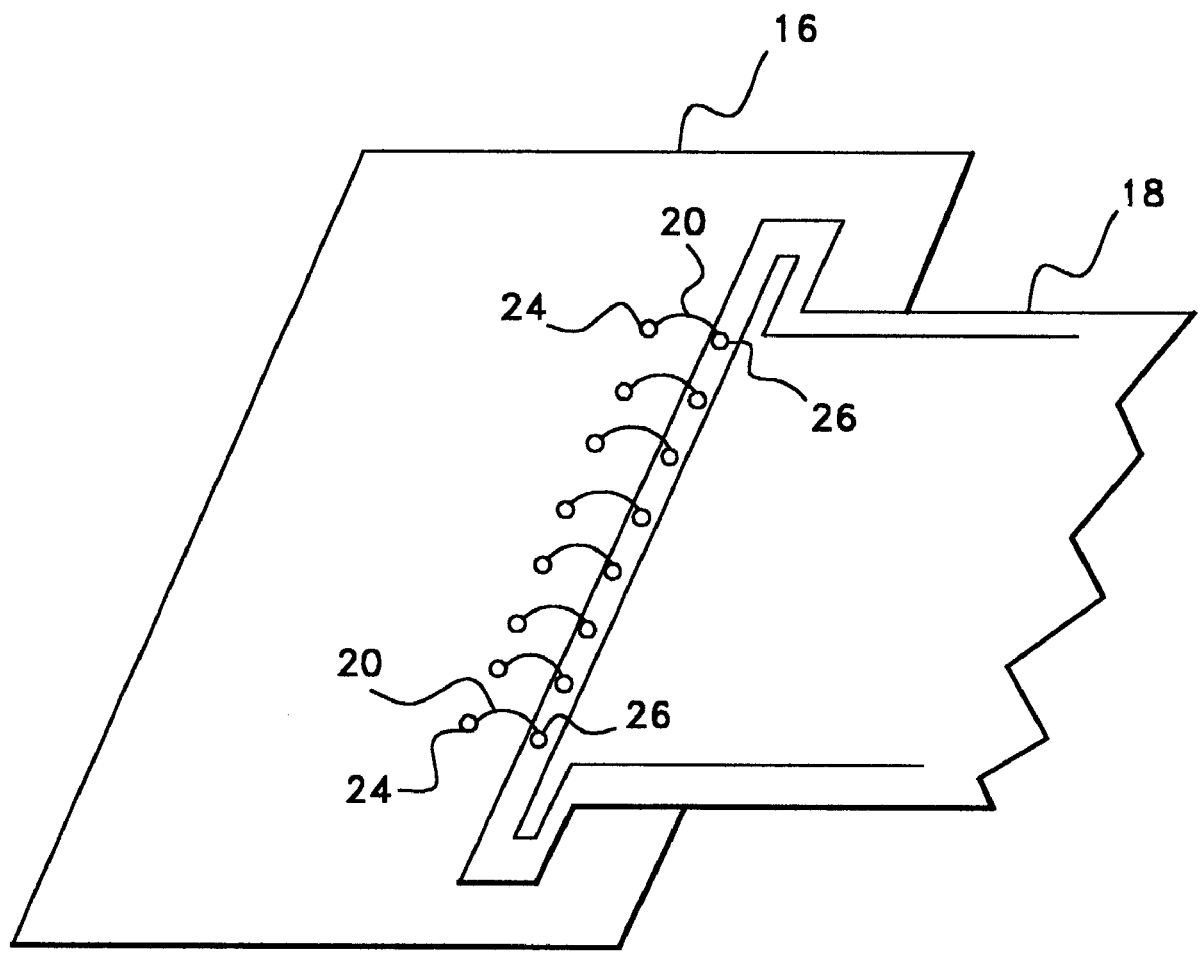
FIG. 2 depicts an exemplar connection of an integrated circuit die to one of two flex circuits in a preferred embodiment of the present invention.

FIG. 2 depicts an exemplar connection of an integrated circuit die 16 to one of two flex circuits 18 in a preferred embodiment of the present invention to create a die-flex combination. As the present description continues, those of skill will recognize that a die-flex combination in accordance with the present invention may be devised in a variety of particular manners including using one or two flex circuits to provide connection to die 16, as well as using flex circuitry having one or more conductive layers. Preferably, the flex circuitry will articulate connective structures such as flex contacts and traces that will later be described.

As shown in FIG. 2, die pads 24 on die 16 are connected to flex attachments 26 of flex 18 by connections 20 which, in the illustrated exemplar, are wire bonding connections. Die pads 24 are just one type of die connective site that may be employed in the present invention. Other die connective sites such as flip-chip, tab and connective rings, balls, or pads may be employed. Die connective sites may also be construed to include combinations of such structures to provide a connective site for the die. Wire bonding is well known in the art and those of skill will appreciate that many other methods may be used to provide connections 20 between die 16 and the flex circuitry employed for the invention. For example, tab or flip-chip or other attachment techniques known in the art can be profitably used to implement connections 20. Those of skill will also appreciate that die pads 24 of die 16 can be arranged in a variety of configurations across the IC. As is known in the art, through die pads 24, die 16 expresses data and instructions as well as ground and voltage connections.

Flex 18 may be configured to interconnect to die 16 with other connective configurations. For example, as a variant on the flip-chip connectivity scheme, flex attachments 26 may be placed on the side of flex circuits 18 opposite that shown in FIG. 2 to place the flex attachments 26 immediately adjacent to the surface of die 16 to provide direct connection between die 16 and flex circuitry 18. It should also be understood that in the preferred embodiment shown in FIG. 1, two flex circuits 18 are employed but implementations of the invention can be devised using one flex circuit 18.

Figure 3:
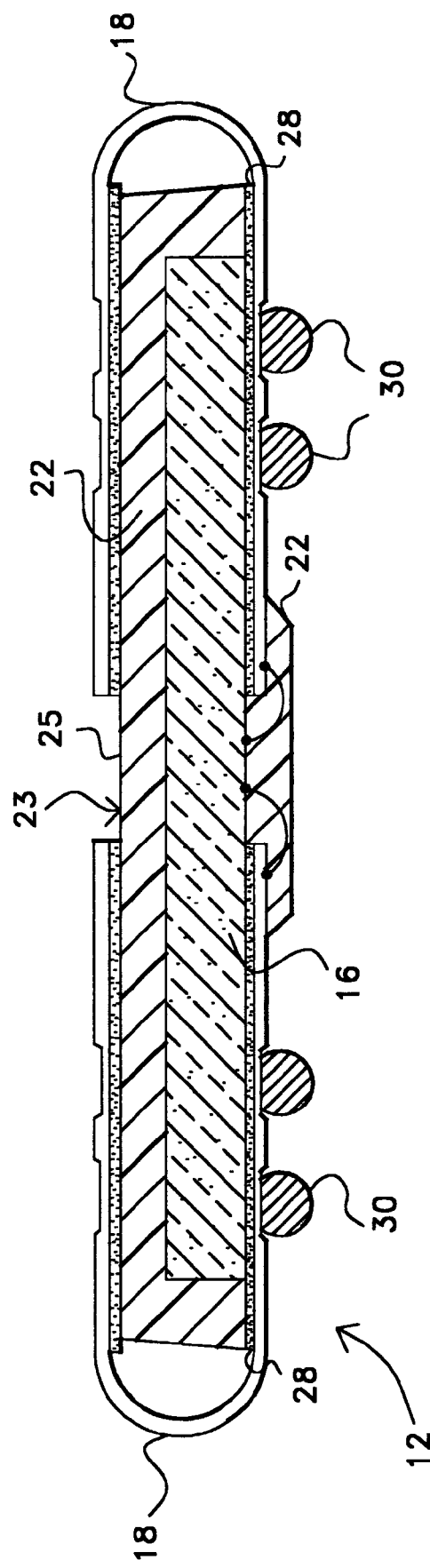
FIG. 3 depicts an elevation view of an integrated lower stack element in accordance with a preferred embodiment of the present invention.

FIG. 3 depicts an elevation view of an integrated lower stack element 12 before its assembly into a module 10. Die 16 is placed adjacent to flex circuits 18 and fixed in place with adhesive 28. A variety of adhesive methods are known in the art and, in a preferred embodiment, an adhesive is used that has thermally conductive properties.

Figure 4:
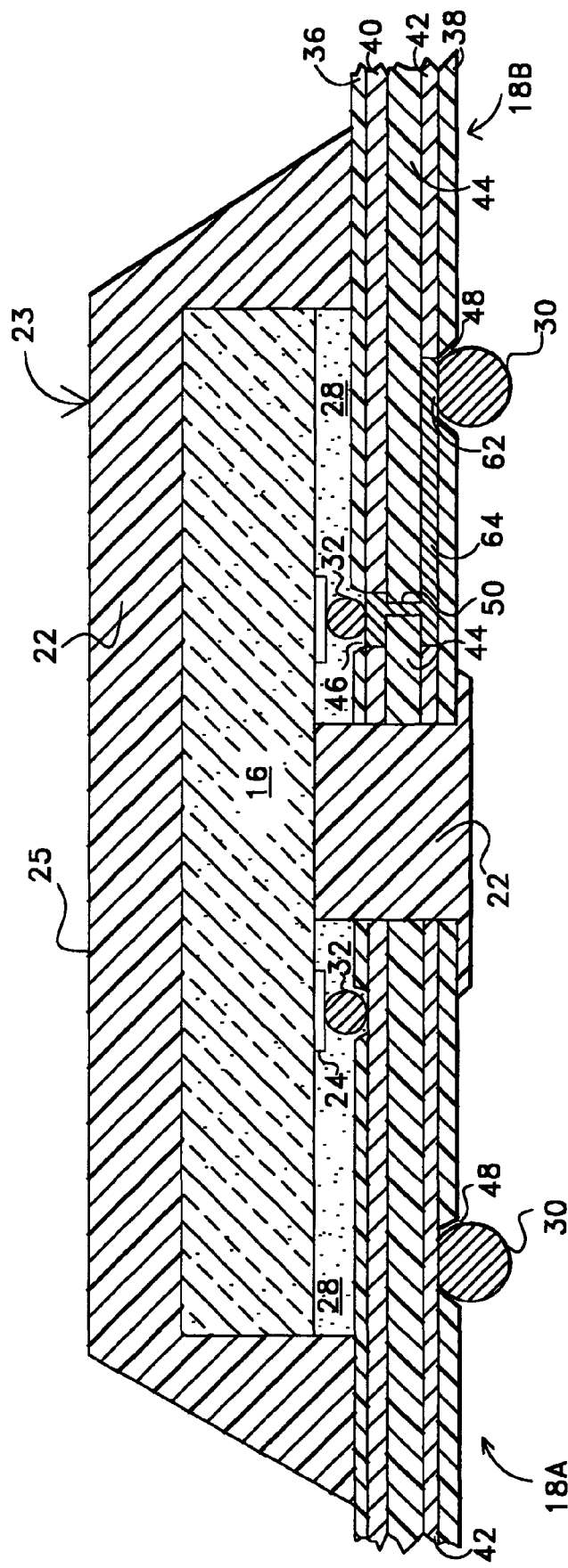
FIG. 4 depicts an exemplar integration of a die in a flip-chip configuration with flex circuitry in accordance with a preferred embodiment of the present invention.

With reference to FIG. 4, in a preferred embodiment, portions of flex circuits 18A and 18B are fixed to die 16 by adhesive 28 which may be a liquid or tape adhesive or may be placed in discrete locations across the package. When used, preferably, adhesive 28 is thermally conductive. Adhesives that include a flux are used to advantage in some steps of assembly of module 10. Layer 28 may also be a thermally conductive medium or body to encourage heat flow.

As shown in this preferred embodiment, module contacts 30 are fixed along flex circuits 18A and 18B opposite the side of the flex circuits nearest to which die 16 is adjacent. The shown preferred module contacts 30 are familiar to those in the art and may be comprised of eutectic, lead-free, solid copper, or other conductive materials. Other contact implementing structures may be used to create module contacts 30 as long as the conductive layer or layers of the flex circuitry can be connected to module contacts 30 to allow conveyance of the signals conducted in flex circuits 18 to be transmitted to an environment external to integrated lower stack element 12. Balls are well understood, but other techniques and structures such as connective rings, built-up pads, or even leads may be placed along flex circuits 18 to create module contacts 30 to convey signals from module 10 to an external environment. Any of the standard JEDEC patterns may be implemented with module contacts 30 as well as custom arrays of module contacts for specialized applications.

FIG. 4 depicts the integration of die 16 devised in a flip-chip configuration with two flex circuits 18A and 18B in accordance with a preferred embodiment of the present invention. Those of skill will understand that the depiction of FIG. 4 is not drawn to scale. Die 16 exhibits die pads 24 along a lower surface of the die. Attached to die pads 24 are die connectors 32 which, in the depicted embodiment, are flip-chip balls or connectors. As shown, flex circuits 18A and 18B have module contacts 30.

Any flexible or conformable substrate with a conductive pattern may be used as a flex circuit in the invention. The preferred flex circuitry will employ more than one conductive layer, but the invention may be implemented with flex circuitry that has only a single conductive layer.

Even though single conductive layer flex circuitry may readily be used in the invention, flex circuit 18 is preferably a multi-layer flexible circuit structure that has at least two conductive layers. This is particularly appropriate where frequencies to be encountered are higher. Preferably, the conductive layers are metal such as copper alloy 110 although any conductive material may be employed in this role. The use of plural conductive layers provides advantages such as the creation of a distributed capacitance across module 10 intended to reduce noise or bounce effects that can, particularly at higher frequencies, degrade signal integrity, as those of skill in the art will recognize.

The entire flex circuit may be flexible or, as those of skill in the art will recognize, a PCB structure made flexible in certain areas to allow conformability around body 23 and rigid in other areas for planarity along surfaces may be employed as an alternative flex circuitry in the present invention. For example, structures known as rigid-flex may be employed.

Flex circuits 18A and 18B shown in FIG. 4 are comprised of multiple layers. Depicted flex circuits 18A and 18B have a first outer surface 36 and a second outer surface 38. The depicted preferred flex circuits 18A and 18B have two conductive layers interior to first and second outer surfaces 36 and 38. In the depicted preferred embodiment, first conductive layer 40 and second conductive layer 42 are interior to first and second outer surfaces 36 and 38, respectively. Intermediate support layer 44 lies between first conductive layer 40 and second conductive layer 42. There may be more than one intermediate layer, but an intermediate layer of polyimide is preferred. Preferably, the intermediate layer provides mechanical support for the flex circuitry.

It should be understood that in some embodiments of the invention, there will be fewer layers employed in flex circuit 18. For example, a flex circuit 18 may be devised for use in the present invention that lacks first outer surface 36 and/or second outer surface 38. In such a case, first conductive layer 40 will be on the surface of the particular flex circuit 18. Where there is a first outer surface, to make contact with first conductive layer 40 as shown in FIG. 4, die connectors 32 pass through windows 46 to reach first conductive layer 40. Similarly, where there is a second outer surface 38, module contacts 30 pass through windows 48 in second outer surface 38 to reach second conductive layer 42.

In a preferred embodiment, first conductive layer 40 is employed as a ground plane, while second conductive layer 42 provides the functions of being a signal conduction layer and a voltage conduction layer. Thus, second conductive layer 42 is employed to implement signal connections between integrated lower stack element 12 and upper IC element 14, while first conductive layer 40 is employed to implement ground connections between integrated lower stack element 12 and upper IC element 14. Those of skill will note that roles of the first and second conductive layers may be reversed. This may be implemented by flex layer design or by attendant use of interconnections. As is understood, thermal management is typically related to conductive layer materials and mass as well as the proximity between the die and the conductive layer.

Selective connections between first and second conductive layers 40 and 42 may be implemented with vias such as the via indicated in FIG. 4 by reference 50. There are, however, many other alternative methods to provide any needed connections between the conductive layers. For example, appropriate connections may be implemented by any of several well-known techniques such as plated holes or solid lines or wires. Thus, the connections need not literally be implemented with vias.

As will be illustrated in later figures, traces are delineated in conductive layers to convey, where needed, signals between selected module contacts 30 and particular die connectors 32 in the case of flip-chip style die 16 or between module contacts 30 and flex connectors 26 in the case where wire-bond connections 20 are implemented or between upper and lower flex contacts as will be described herein. Those of skill will recognize that traces can be implemented in a variety of configurations and manners and where die connectors are positioned coincident with module contact placement, trace use is minimized. For example, in some cases, if the die connectors 32 (illustrated as flip-chip connectors) are placed appropriately on die 16, a via 50 may be used to directly connect a selected die connector 32 to a selected module contact 30 without intermediate lateral conveyance between the two through a trace. Where a single conductive layer flex circuitry is employed in an embodiment, there will be no need for a via if a die connector 32 is positioned coincident with a module contact 30 to implement connection through a lower flex contact 62 such as is depicted in FIG. 5.

Figure 5:
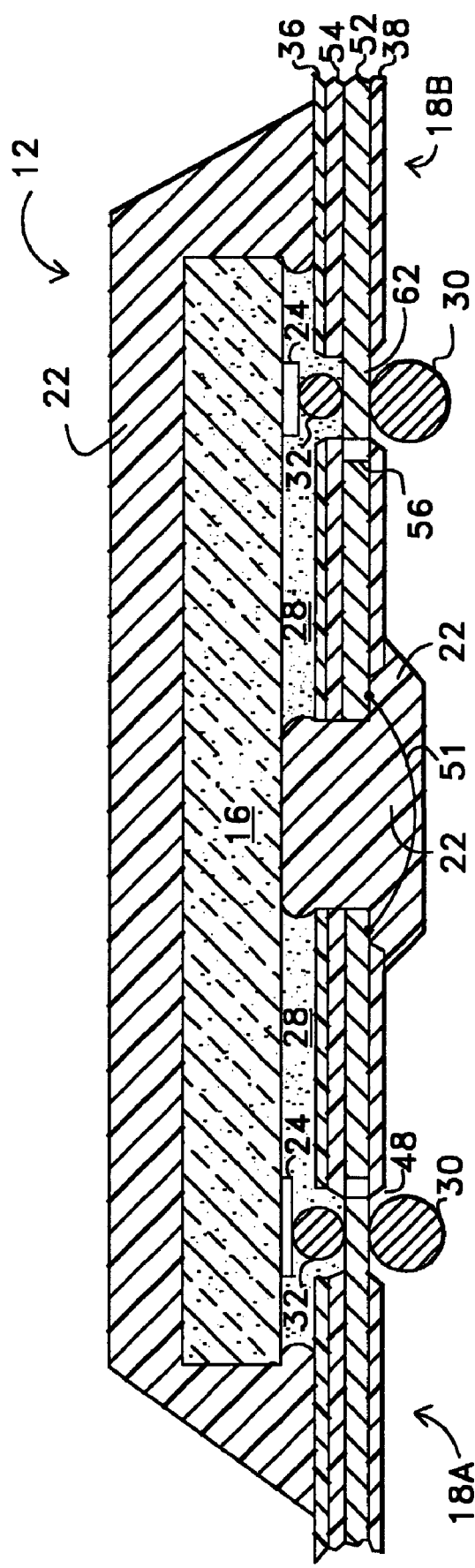
FIG. 5 depicts an exemplar construction details of an integrated lower stack element in accordance with a preferred embodiment of the present invention.

FIG. 5 illustrates an exemplar construction of an integrated lower stack element 12 in accordance with an alternative preferred embodiment of the present invention that employs flex circuitry having a single conductive layer. As shown, die 16 is appended to flex circuits 18A and 18B with adhesive 28. The depicted embodiment also exhibits optional inter-flex connective 51 that passes through the part of protective surround 22 that lies between flex circuit 18A and flex circuit 18B. The inter-flex connective may consist of one or more wires or other connective structures such as may be implemented in wire bond, lead frame or other form.

As those of skill will recognize, die 16 is connected to flex circuits 18A and 18B through die pads 24 and die connectors 32. Flex circuits 18A and 18B are depicted with first and second outer layers 36 and 38, respectively. Support layer 54 provides structure for flex circuits 18A and 18B and conductive layer 52 provides conductivity between die connectors 32 and module contacts 30. Conductive layer 52 also provides conductivity between integrated lower stack element 12 and added elements such as another integrated lower stack element 12 or upper IC element 14 that may be aggregated to create module 10.

Those of skill will recognize that in the depicted embodiment, conductive layer 52 is disposed closer to module contacts 30 than is support layer 54. This relative placement is preferred but not required. Such persons will also recognize that support layer 54 provides a support function similar to that provided by intermediate layer 44 in multi-layer flex circuitry embodiments such as those earlier described herein.

Demarcation gap 56 depicted in FIG. 5 provides selective isolation of lower flex contact 62 of conductive layer 52 from areas of conductive layer 52 that may provide other functions or other interconnections between different ones of die connectors 32 and module contacts 30 or other interconnections to other elements of module 10. For example, in the embodiment of FIG. 5, flex circuits 18A and 18B are shown as having one conductive layer (i.e., layer 52). Therefore, in the depicted alternative embodiment, that one conductive layer 52 is intended to provide interconnectivity functions for module 10. Consequently, particular interconnection features should be isolated from each other to allow rational connections to be implemented in module 10 where conductive layer structures are used. This is depicted by demarcation gap 56, but those of skill will understand that demarcation gap 56 is merely exemplary and assorted gaps and traces may be used in conductive layer 52 just as they may (but need not necessarily) be used in conductive layers in multi-conductive layer flex embodiments to provide rational interconnectivity features for module 10. However, as those of skill will recognize, the present invention may be implemented with a flex circuitry that exhibits a dedicated connective network of individual traces and/or interconnections.

With continuing reference to FIG. 5, a signal may be conveyed from die 16 through die pad 24 though die connector 32 through lower flex contact 62 at conductive layer 52 to module contact 30. Such connection paths may convey voltage, ground or data or instruction signal connections in and out of die 16.

In the depicted embodiment of FIG. 5, lower flex contacts 62 provide connection between die 16 and module contacts 30 as well as participating in selected connections between die 16 and the circuit of upper IC element 14. However, in addition, a set of flex contacts such as those identified in later FIG. 7 as upper flex contacts with respect to a second conductive layer 42 shown in FIG. 7, may, in the single conductive layer embodiment of FIG. 5, participate in the connection between the circuit of upper IC element 14 and the flex circuitry employed in the particular embodiment.

Figure 6:
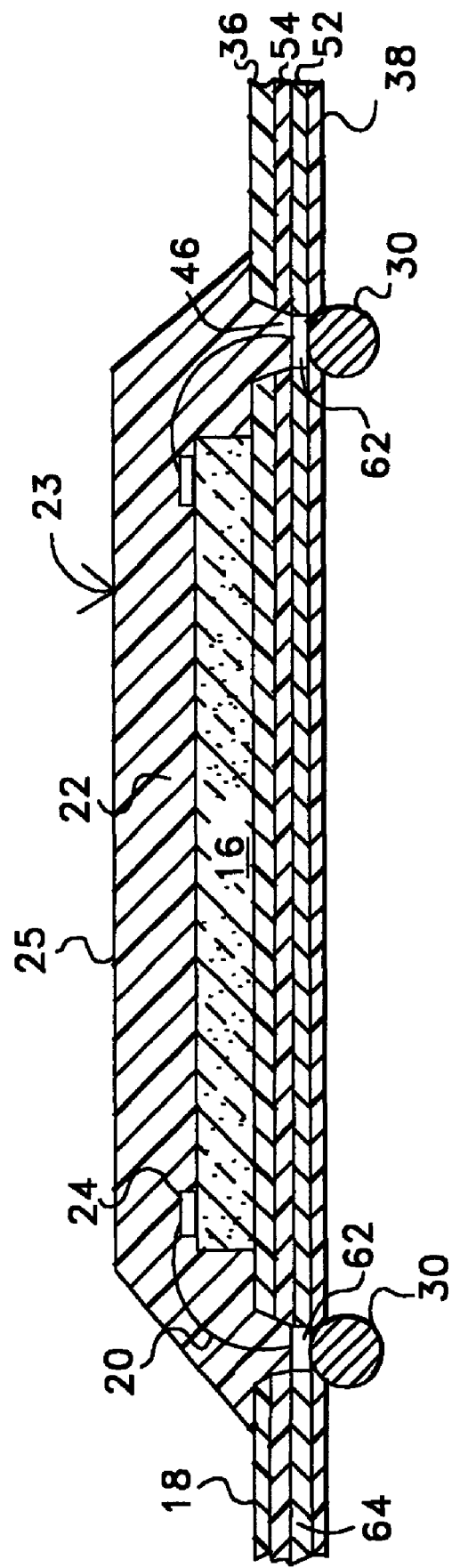
FIG. 6 depicts an exemplar construction details of an integrated lower stack element in accordance with another preferred embodiment of the present invention.

FIG. 6 depicts an alternative preferred embodiment of the present invention. In the embodiment as depicted in FIG. 6, die 16 is disposed above first outer surface 36 while die connective sites which, in this instance, are die pads 24 are connected to lower flex contacts 62 at the level of conductive layer 52 with wire bond connections 20 through windows 46. Body 23 is formed about the depicted die-flex combination and, in the preferred embodiment, is formed employing protective surround 22. Module contacts 30 are connected to the lower flex contacts 62 to express the appropriate set of signals emanating from die 16. As those of skill will understand as to the preferred embodiment of FIG. 6, when integrated lower stack element 12 is incorporated into a module 10, a set of upper contacts are articulated in the conductive layer 52 to provide connective facility for an upper IC element 14 or another integrated lower stack element 12. Further, traces 64 may be employed to provide connections between those upper flex contacts and the lower flex contacts and appropriate module contacts 30. Those of skill will recognize that in some instances, there may be module contacts 30 that are connected only to an upper element in a particular module 10.

Figure 7:
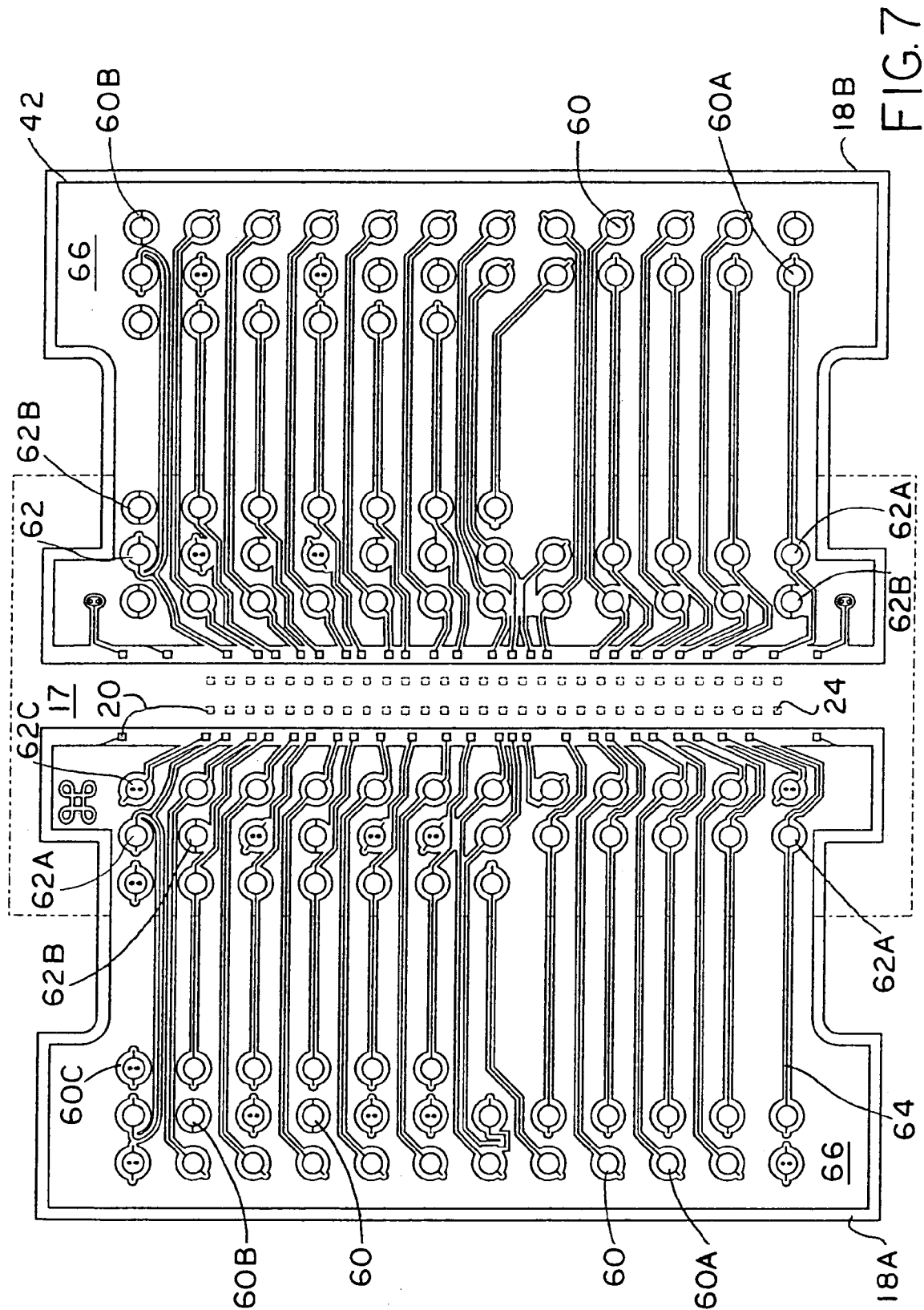
FIG. 7 depicts an exemplar conductive layer in a preferred flex circuitry employed in a preferred embodiment of the present invention.

FIG. 7 illustrates an exemplar second conductive layer 42 as may be implemented in flex circuits 18A and 18B of a preferred embodiment. Also shown is a depiction of die 16 and its underside 17. Identified in FIG. 7 are upper flex contacts 60 and lower flex contacts 62 that are at the level of second conductive layer 42 of flex circuits 18A and 18B. Upper flex contacts 60 and lower flex contacts 62 are conductive material and, preferably, are solid metal. Only some of upper flex contacts 60 and lower flex contacts 62 are identified with reference numerals in FIG. 7 to preserve clarity of the view.

Each of flex circuits 18A and 18B in the depicted preferred embodiment have both upper flex contacts 60 and lower flex contacts 62. Depending upon the contact pattern of die 16 and upper IC element 14, some embodiments may exhibit only lower or only upper flex contacts in flex circuits 18A or 18B.

In the preferred embodiment depicted in FIG. 7, lower flex contacts 62 are employed with module contacts 30 to provide connective facility for integrated lower stack element 12 in module 10. Thus, in a preferred embodiment, module contacts 30 are connected to lower flex contacts 62 as shown in exemplar fashion in FIG. 4 and in FIG. 5 in which figure a trace 64 is shown in the connective path between via 50 and lower flex contact 62. However, as those of skill will recognize, traces between selected upper and lower flex contacts provide a connective path between upper IC element 14 and integrated lower stack element 12 and/or directly to module contacts 30.

As those of skill will recognize, interconnection of respective contacts of upper IC element 14 and integrated lower stack element 12 will also preferably provide a thermal path between the two elements 12 and 14 to assist in moderation of thermal gradients through module 10. Those of skill will notice that between first and second conductive layers 40 and 42, there is at least one intermediate layer 44 that, in a preferred embodiment, is a polyimide. Placement of such an intermediate layer between ground-conductive first conductive layer 40 and signal/voltage conductive second conductive layer 42 provides, in the combination, a distributed capacitance that assists in mitigation of ground bounce phenomena to improve high frequency performance of module 10.

With continuing reference to FIG. 7, depicted are various types of upper flex contacts 60, various types of lower flex contacts 62, and traces 64. Lower flex contacts 62A are connected to corresponding selected upper flex contacts 60A with signal traces 64. To enhance the clarity of the view, only exemplar individual flex contacts 62A and 60A and traces 64 are literally identified in FIG. 7.

To improve high frequency performance, signal traces 64 may be devised to exhibit path routes determined to provide substantially equal signal lengths between corresponding flex contacts 60A and 62A. For example, such relatively equal length traces are illustrated in U. S. Pat. No. 6,576,992 which is incorporated by reference into this application.

As shown in the depicted preferred embodiment of FIG. 7, traces 64 are separated from the larger surface area of second conductive layer 42 that is identified as VDD plane 66. VDD plane 66 may be in one or more delineated sections but, preferably is contiguous per flex circuit 18. Further, other embodiments may lack VDD plane 66.

Lower flex contacts 62B and upper flex contacts 60B provide connection to VDD plane 66. In a preferred embodiment, upper flex contacts 60B and lower flex contacts 62B selectively connect upper IC element 14 and integrated lower stack element 12, respectively, to VDD plane 66.

Lower flex contacts 62 that are connected to first conductive layer 40 by vias 50 are identified as lower flex contacts 62C. To enhance the clarity of the view, only exemplar individual lower flex contacts 62C are literally identified in FIG. 7. Upper flex contacts 60 that are connected to first conductive layer 40 by vias 50 are identified as upper flex contacts 60C.

In some embodiments, as shown in incorporated U.S. Pat. No. 6,576,992, module 10 will exhibit an array of module contacts 30 that has a greater number of contacts than the constituent elements of module 10 individually exhibit. In such embodiments, some of the module contacts 30 may contact lower flex contacts 62 that do not make contact with one of the die contacts 24 of integrated lower stack element 12 but are connected to upper IC contacts 19 of upper IC element 14. This allows module 10 to express a wider datapath than that expressed by constituent integrated lower stack element 12 or upper IC element 14.

A module contact 30 may also be in contact with a lower flex contact 62 to provide a location through which different levels of constituent elements of the module may be enabled when no unused contacts are available or convenient for that purpose.

Those of skill will recognize that as flex circuitry 18 is partially wrapped about lateral side 21 of integrated lower stack element 12, first conductive layer 40 becomes, on the part of flex 18 disposed above upper surface 23 of integrated lower stack element 12, the lower-most conductive layer of flex 18 from the perspective of upper IC element 14. In the depicted embodiment, those upper IC element contacts 19 of upper IC element 14 that provide ground (VSS) connections are connected to the first conductive layer 40. First conductive layer 40 lies beneath, however, second conductive layer 42 in that part of flex 18 that is wrapped above lower stack element 12. Consequently, in the depicted preferred embodiment, those upper flex contacts 60 that are in contact with ground-conveying upper IC element contacts 25 of upper IC element 14 have vias that route through intermediate layer 44 to reach first conductive layer 40. These vias may preferably be "on-pad" or coincident with the flex contact 60 to which they are connected.

As those of skill will recognize, there may be embodiments of the present invention that may profitably employ off-pad vias such as are described in previously cited U.S. application Ser. No. 10/005,581, filed Oct. 26, 2001, (the "'581 application) pending, which is incorporated by reference herein.

Those of skill who refer to the '581 application will note that the figures in that application will be instructive in teaching details concerning a flex circuitry construction for preferred embodiments of the present invention. Further, as those of skill will recognize, the details on location and relationships between upper and lower flex contacts as described in the '581 application are useful to preferred embodiments of the present invention as modified to fit the particulars of the considered embodiment. Further, alternative embodiments depicted in the '581 application are instructive in understanding alternatives available for embodiments of the present invention. For example, the '581 application provides teachings that are descriptive of features that may be employed to advantage in preferred embodiments in accordance with the present invention where module 10 expresses a datapath that is wider than that of the constituent circuits of either integrated lower stack element 12 or upper IC element 14 or where differential enablement of the respective elements of module 10 is desired as those skilled in the field will understand.

Figure 8:
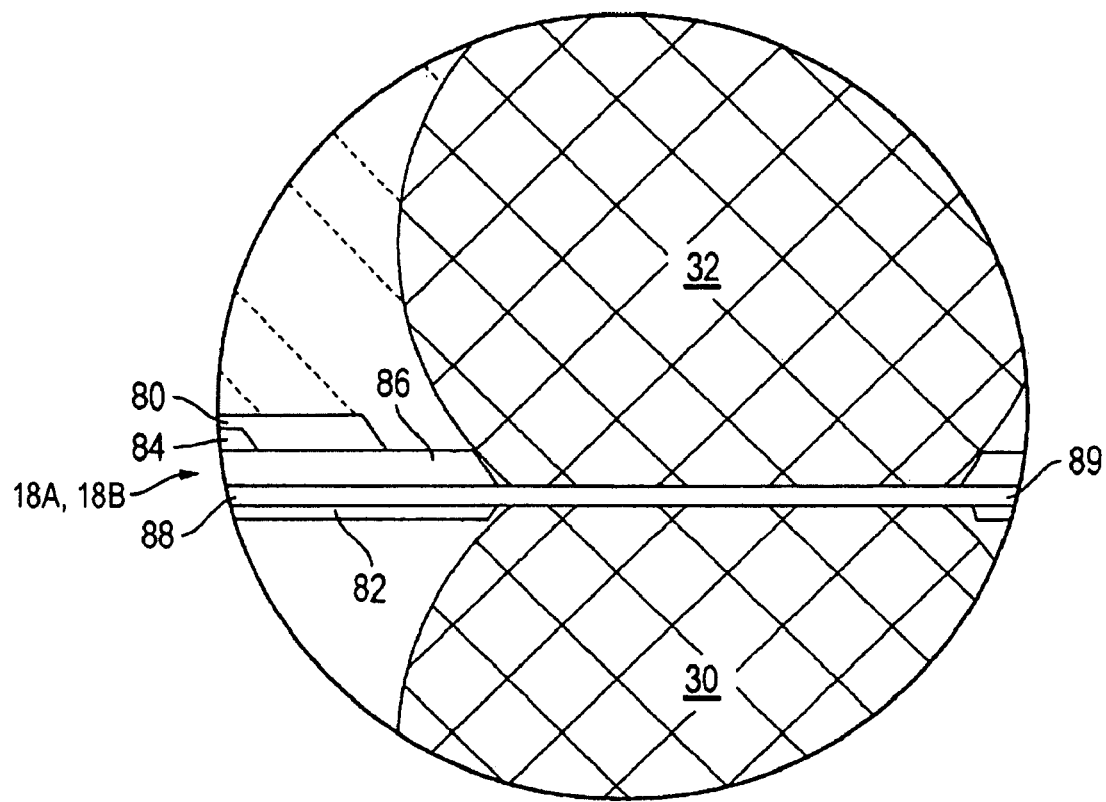
FIG. 8 is an enlarged detail of an exemplar connection in a preferred embodiment of the present invention.

An embodiment of flex circuit 18A, 18B is shown in FIG. 8 to be comprised of multiple layers including a first outer surface 80 and a second outer surface 82. Flex circuit 18A, 18B has at least two conductive layers interior to first and second outer surfaces 80 and 82. There may be more than two conductive layers in flex circuit 18A, 18B. In the depicted preferred embodiment, first conductive layer 84 and second conductive layer 88 are interior to first and second outer surfaces 80 and 82. Intermediate layer 86 lies between first conductive layer 84 and second conductive layer 88. There may be more than one intermediate layer, but one intermediate layer of polyimide is preferred.

As depicted in FIG. 8, a lower flex contact 89 is preferably comprised from metal at the level of second conductive layer 88 interior to second outer surface 82. Lower flex contact 89 is solid metal in a preferred embodiment and is comprised of metal alloy such as alloy 110. This results in a solid metal pathway from die 16 to an application board thereby providing a significant thermal pathway for dissipation of heat generated in module 10.

FIG. 8 is an enlarged detail of an exemplar connection between connector 32 and example module contact 30 through lower flex contact 89 to illustrate the solid metal path from die 16 to module contact 30 and, therefore, to an application PWB to which module 10 is connectable. As shown in FIG. 8, lower flex contact 89 is at second conductive layer 88 that is interior to first and second outer surface layers 80 and 82 respectively, of flex circuit 18A, 18B.

Figure 9:
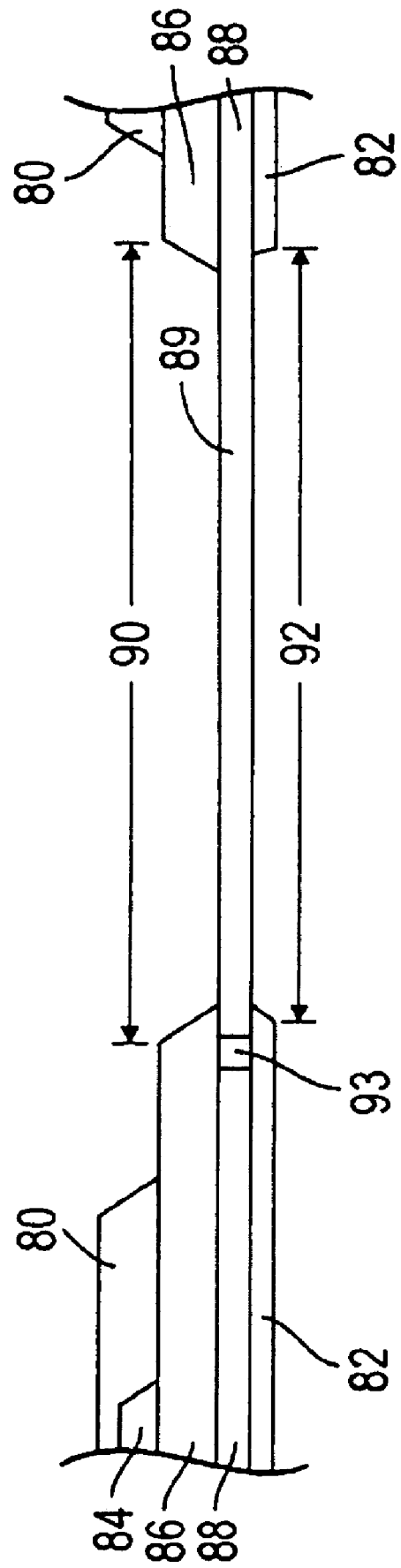
FIG. 9 is an enlarged depiction of an exemplar area around a lower flex contact in a preferred embodiment of the present invention.

FIG. 9 is an enlarged depiction of an exemplar area around lower flex contact 89 in a preferred embodiment. Windows 90 and 92 are opened in first and second outer surface layers 80 and 82 respectively, to provide access to particular lower flex contacts 89 residing at the level of second conductive layer 88 in the flex. Upper flex contacts (not shown) are contacted by contacts of upper IC element 14. Lower flex contacts 89 and upper flex contacts are particular areas of conductive material (preferably metal such as alloy 110) at the level of second conductive layer 88 in the flex. Upper flex contacts and lower flex contacts 89 are demarked in second conductive layer 88, and may be connected to or isolated from the conductive plane of second conductive layer 88. Demarking a lower flex contact 89 from second conductive layer 88 is represented in FIG. 9 by demarcation gap 93 shown at second conductive layer 88. Where an upper or lower flex contact is not completely isolated from second conductive layer 88, demarcation gaps do not extend completely around the flex contact. Contacts 32 of die 16 pass through window 90 opened through first outer surface layer 80, first conductive layer 84, and intermediate layer 86, to contact an appropriate lower flex contact 89. Window 92 is opened through second outer surface layer 82, through which module contacts 30 pass to contact the appropriate lower flex contact 89.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:
1. A circuit module comprising:
(a) an integrated lower stack element comprising;
an integrated circuit die having a plurality of die connective sites;
a flexible circuit having first and second conductive layers, the flexible circuit being disposed in part beneath and affixed to and connected with the integrated circuit die to form a die-flex combination; and
a protective structure set about the die-flex combination to cover at least a portion of the die and at least a portion of the flexible circuit and create a body having an upper surface above which are placed portions of the flexible circuit; and
(b) an upper IC element having a plurality of upper IC contacts, the upper IC element being disposed in stacked conjunction with the integrated lower stack element, the upper IC element and integrated lower stack element being connected through the flexible circuit;
wherein the flexible circuit further comprises:
an intermediate layer between the first and second conductive layers, the second conductive layer having demarked first and second flex contacts, the second flex contacts being accessible through windows formed through the first conductive layer, and the intermediate layer, the first flex contacts in electrical connection with the upper IC element and the second flex contacts in electrical connection with the integrated circuit die.

2. The circuit module of claim 1 in which a data signal connection between the upper IC element and the integrated lower stack element is implemented at the second conductive layer of the flex circuit.

3. The circuit module of claim 1 in which a data signal connection between the upper IC element and the integrated lower stack element is implemented at the first conductive layer of the flex circuit.

4. The circuit module of claim 1 in which:
a data set of the plurality of upper IC contacts expresses an n-bit datapath;
a data set of the plurality of die connective sites expresses an n-bit datapath; and
a set of module contacts expresses a 2n-bit datapath that combines the n-bit datapath of the data set of the plurality of upper IC contacts and the n-bit datapath of the data set of the plurality of die connective sites.

5. The circuit module of claim 1 in which the second conductive layer comprises at least one demarked voltage plane and a voltage set of upper flex contacts and a voltage set of lower flex contacts that connect voltage conductive die connective sites and voltage conductive upper IC contacts to one of the at least one voltage planes.

6. A flex circuit connecting an upper IC element and an integrated circuit die, in a circuit module, the flex circuit comprising:
first and second outer layers; and
first and second conductive layers, between which there is an intermediate layer, the first and second conductive layers and the intermediate layer being interior to the first and second outer layers, the second conductive layer having demarked first and second flex contacts, the first flex contacts being accessible through first windows through the second outer layer and the second flex contacts being accessible through second windows through the first outer layer, the first conductive layer, and the intermediate layer, the first flex contacts in electrical connection with the upper IC element and the second flex contacts in electrical connection with the integrated circuit die;
wherein the flex circuit is disposed in part beneath and is combined with the integrated circuit die to form a die-flex combination and wherein a protective structure is set about the die-flex combination to cover at least a portion of the die and at least a portion of the flex circuit, the protective structure having an upper surface above which are placed portions of the flex circuit.

7. The flex circuit of claim 6 in which the second flex contacts are accessible through module windows through the second outer layer.

8. The flex circuit of claim 6 in which the first and second conductive layers are metal.

9. The flex circuit of claim 8 in which the metal of the first and second conductive layers is alloy 110.

10. The flex circuit of claim 6 in which selected ones of the first flex contacts are connected to selected ones of the second flex contacts.

11. The flex circuit of claim 10 in which the connected selected ones of the first and second flex contacts are connected with traces.

12. The flex circuit of claim 6 in which selected ones of the first flex contacts and selected ones of the second flex contacts are connected to the first conductive layer.

13. The flex circuit of claim 6 in which selected ones of the first flex contacts and selected ones of the second flex contacts are connected to the first conductive layer with vias.

14. A circuit module that employs the flex circuit of claim 6 to connect selected die contacts of an integrated circuit die to selected contacts of an upper IC element.

* * * * *

UNITED STATES PATENT AND TRADEMARK OFFICE
CERTIFICATE OF CORRECTION

| | |
|---|---|
| PATENT NO. | : 7,485,951 B2 |
| APPLICATION NO. | : 10/435192 |
| DATED | : February 3, 2009 |
| INVENTOR(S) | : David L. Roper |

Page 1 of 1

It is certified that error appears in the above-identified patent and that said Letters Patent is hereby corrected as shown below:

In claim 6, column 12, line 44, delete "die," and insert -- die --.

Signed and Sealed this

Twenty-eighth Day of April, 2009

JOHN DOLL
*Acting Director of the United States Patent and Trademark Office*